United States Patent
Ueda

(10) Patent No.: US 6,340,643 B2
(45) Date of Patent: Jan. 22, 2002

(54) TREATMENT SOLUTION SUPPLY METHOD

(75) Inventor: Issei Ueda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/783,596

(22) Filed: Feb. 15, 2001

(30) Foreign Application Priority Data

Feb. 18, 2000 (JP) ...................................... 2000-041561

(51) Int. Cl.[7] .......................... H01L 21/31; H01L 21/469
(52) U.S. Cl. ...................... 438/780; 438/758; 438/778; 438/782
(58) Field of Search ................................ 438/758, 778, 438/780, 782

(56) References Cited

U.S. PATENT DOCUMENTS

| | | | |
|---|---|---|---|
| 5,405,443 A | | 4/1995 | Akimoto et al. ............ 118/668 |
| 5,599,394 A | * | 2/1997 | Yabe et al. ................. 118/319 |
| 6,059,880 A | * | 5/2000 | Kitano et al. ................. 118/52 |
| 6,245,148 B1 | * | 6/2001 | Liang et al. ................ 118/683 |

* cited by examiner

*Primary Examiner*—Alexander G. Ghyka
(74) *Attorney, Agent, or Firm*—Oblon, Spivak, McClelland, Maier & Neustadt, P.C.

(57) ABSTRACT

The present invention is a treatment solution supply method for supplying a treatment solution on a substrate by a pump through a supply path, which connects a treatment solution supply source and a discharge nozzle, wherein a storage portion for storing the treatment solution temporarily is disposed in the supply path between the treatment solution supply source and the pump. In the present invention another pump is further disposed in the supply path between the storage portion and the treatment solution supply source for supplying the treatment solution to the storage portion. The present invention comprises the step of maintaining the level height of the treatment solution in the storage portion at a predetermined height by supplying the treatment solution to the storage portion by the said another pump. According to the present invention, the pressure of a primary side of the pump is constantly maintained the same. As a result, a force feed pressure of a secondary side of the pump is also kept steady, thereby keeping the discharge pressure of the treatment solution from the discharge nozzle steady. Therefore, the treatment solution with a predetermined discharge pressure is discharged on the substrate, and a substrate processing is performed in a preferable way.

4 Claims, 12 Drawing Sheets

TREATMENT SOLUTION SUPPLY METHOD

BACKGROUND OF THE INVENTION

1. Field of the Invention

The present invention relates to a treatment solution supply method and a treatment solution supply unit for a substrate.

2. Description of the Related Art

In a photolithography process in semiconductor device fabrication processes, for example, resist coating treatment for applying a resist solution to the surface of a wafer to form a resist film, exposure treatment for exposing the wafer in a pattern, developing treatment for performing development treatment for the exposed wafer, and so on are performed in respective processing units to form a predetermined circuit pattern on the wafer by a series of these treatments.

To describe a conventional resist solution supply system of a resist coating unit for performing resist coating treatment referring to FIG. 12, from a gallon bottle 131, for example, which works as a resist solution supply source, through a pipeline 134, which connects the gallon bottle 131 with a resist solution discharge nozzle 133, to the resist solution discharge nozzle 133, a resist solution in the gallon bottle is forcibly fed by a pump 132, so that the resist solution is supplied on a wafer W to the discharge nozzle 133 to perform resist coating treatment. When there are plural gallon bottles, they are sometimes disposed in two tiers up and down due to space restriction.

However, when the level height in the gallon bottle 131 becomes lower as the supply to the resist solution discharge nozzle 133 proceeds, the pressure given on a primary side of the pump 132 changes, which changes a force feed pressure on a secondary side of the pump 132 delicately, and thus, there is a fear that the supply pressure to the resist solution discharge nozzle 133 changes. Then, as a result, since the discharge pressure from the resist solution discharge nozzle 133 changes, and a discharge amount of the resist solution on the wafer W and an impact on the surface of the wafer W fluctuates, there is a fear that a uniform predetermined resist film is not formed.

When the gallon bottles are disposed in two tiers up and down, the level height of the resist solution of the gallon bottle in an upper tier differs greatly from that of the gallon bottle in a lower tier. Therefore, when the resist solution is forcibly fed to the resist solution discharge nozzle 133 selectively from either of the gallon bottles by the above-mentioned pump 132, since from the first the pressure of the primary side of the pump 132 differs in case the resist solution in the upper gallon bottle is selected from in case the lower gallon bottle is selected, the force feed pressure of the secondary side also differs. Consequently, the discharge pressure from the resist discharge nozzle 133 also differs as described above, and the same resist film is not formed on the wafer W when the resist solution is supplied from the upper gallon bottle as when the resist solution is supplied from the lower gallon bottle.

In recent years, especially, since there is a tendency to save a resist solution and so on and make a discharging port small to reduce a discharge amount therefrom, it is feared that even a delicate fluctuation of the discharge pressure may give a great influence on the resist film formed on the wafer.

SUMMARY OF THE INVENTION

The present invention is made in consideration of the above-described points, and its object is to maintain the discharge pressure of a treatment solution discharged on a substrate such as a wafer and so on within a predetermined range to perform a substrate processing in a preferable way when the treatment solution is supplied by a pump from a solution supply source to a discharge nozzle such as a nozzle.

Considering the above object, the present invention, from a first viewpoint of the present invention, is a treatment solution supply method for supplying, with a treatment solution in a treatment solution supply source forcibly fed by a pump, the treatment solution on a substrate through a supply path connecting the treatment solution supply source and a discharge nozzle, wherein a storage portion for storing the treatment solution temporarily is disposed in the supply path between the treatment solution supply source and the pump, and another pump for supplying the treatment solution to the storage portion is disposed in the supply path between the storage portion and the treatment solution supply source, and comprising the step of maintaining the level height of the treatment solution in the storage portion at a predetermined height by supplying the treatment solution to the storage portion by the said another pump.

From another viewpoint of the present invention, the present invention is a treatment solution supply method for supplying, with a treatment solution in a treatment solution supply source forcibly fed by a pump, the treatment solution on a substrate through a supply path connecting the treatment solution supply source and a discharge nozzle, wherein a storage portion for storing the treatment solution temporarily is disposed in the supply path between the treatment solution supply source and the pump, and another pump for supplying the treatment solution to the storage portion is disposed in said supply path between said storage portion and said treatment solution supply source, and comprising the step of maintaining the level height of the treatment solution in the storage portion at a predetermined height by operating the pump in association with the said another pump.

From still another viewpoint of the present invention, the present invention is a treatment solution supply method for supplying, with a treatment solution in a treatment solution supply source forcibly fed by a pump, the treatment solution on a substrate through a supply path connecting the treatment solution supply source and a discharge nozzle, wherein a storage portion for storing the treatment solution temporarily is disposed in the supply path between the treatment solution supply source and the pump, and another pump for supplying the treatment solution to the storage portion is disposed in the supply path between the storage portion and the treatment solution supply source, and comprising the step of detecting the level height in the storage portion, and the step of maintaining the level height of the treatment solution in the storage portion at a predetermined height by supplying the treatment solution to the storage portion from the said another pump only when the level height becomes lower than a predetermined value.

From yet another viewpoint of the present invention, the present invention is a treatment solution supply method for supplying, with a treatment solution in a treatment solution supply source forcibly fed by a pump, a predetermined amount of the treatment solution each time on a substrate through a supply path connecting the treatment solution supply source and a discharge nozzle, wherein a storage portion for storing the treatment solution temporarily is disposed in the supply path between the treatment solution supply source and the pump, and another pump for supplying the treatment solution to the storage portion is disposed in the supply path between the storage portion and the treatment solution supply source, and comprising the step of measuring the number of times the predetermined amount is supplied, and the step of maintaining the level height of the treatment solution in the storage portion at a predetermined height by supplying the treatment solution to the storage portion by the said another pump only when the number of supply times exceeds a predetermined number of times.

A treatment solution supply unit of the present invention is a treatment solution supply unit for supplying, with a treatment solution in a treatment solution supply source forcibly fed by a pump, the treatment solution on a substrate through a supply path connecting the treatment solution supply source and a discharge nozzle, comprising a storage portion, disposed in the supply path between said treatment solution supply source and said pump, for storing the treatment solution temporarily, and another pump, disposed in the supply path between the storage portion and the treatment solution supply source, for supplying the treatment solution to the storage portion.

A treatment solution supply unit from another viewpoint of the present invention is a treatment solution supply unit for supplying, with a treatment solution in a treatment solution supply source forcibly fed by a pump, a predetermined amount of the treatment solution on a substrate each time through a supply path connecting the treatment solution supply source and a discharge nozzle, comprising a storage portion, disposed in the supply path between the treatment solution supply source and the pump, for storing the treatment solution temporarily, another pump, disposed in the supply path between the storage portion and the treatment solution supply source, for supplying the treatment solution to the storage portion, a counter for measuring the number of times said predetermined amount is supplied, and a pump controller for controlling the said another pump based on the result measure by the counter.

According to the present invention, the pressure on a primary side of the pump is constantly maintained at the same pressure by disposing the storage portion between the discharge nozzle and the treatment solution supply source, and further by maintaining the level height in the storage portion by the said another pump. Consequently, the force feed pressure on a secondary side of the pump is also kept steady, which keeps the discharge pressure of the treatment solution from the discharge nozzle steady. As a result, the treatment solution with a predetermined discharge pressure is discharged on the substrate, and a substrate processing is performed in a preferable way.

When the level height of the treatment solution in the storage portion is maintained at a predetermined height by operating the pump in association with the said another pump, the same amount of the treatment solution as that supplied on the substrate by the pump can be supplied to the storage portion by the said another pump. Thus, since the level height in the storage portion is maintained at a predetermined height, the discharge pressure of the treatment solution discharged on the substrate from the discharge nozzle is kept steady to perform a substrate processing in a preferable way.

The level height in the storage portion may be maintained at the predetermined height by measuring the number of supplying times by the pump and supplying the treatment solution to the storage pump by the said another pump only when the number of supplying times exceeds a predetermined times, for example, the number of supplying times corresponding to the level fluctuation in the storage portion causing a fluctuation of the discharge pressure to the degree in which a substrate processing is performed without any problem.

DETAILED DESCRIPTION OF THE PREFERRED EMBODIMENTS

Figure 1:
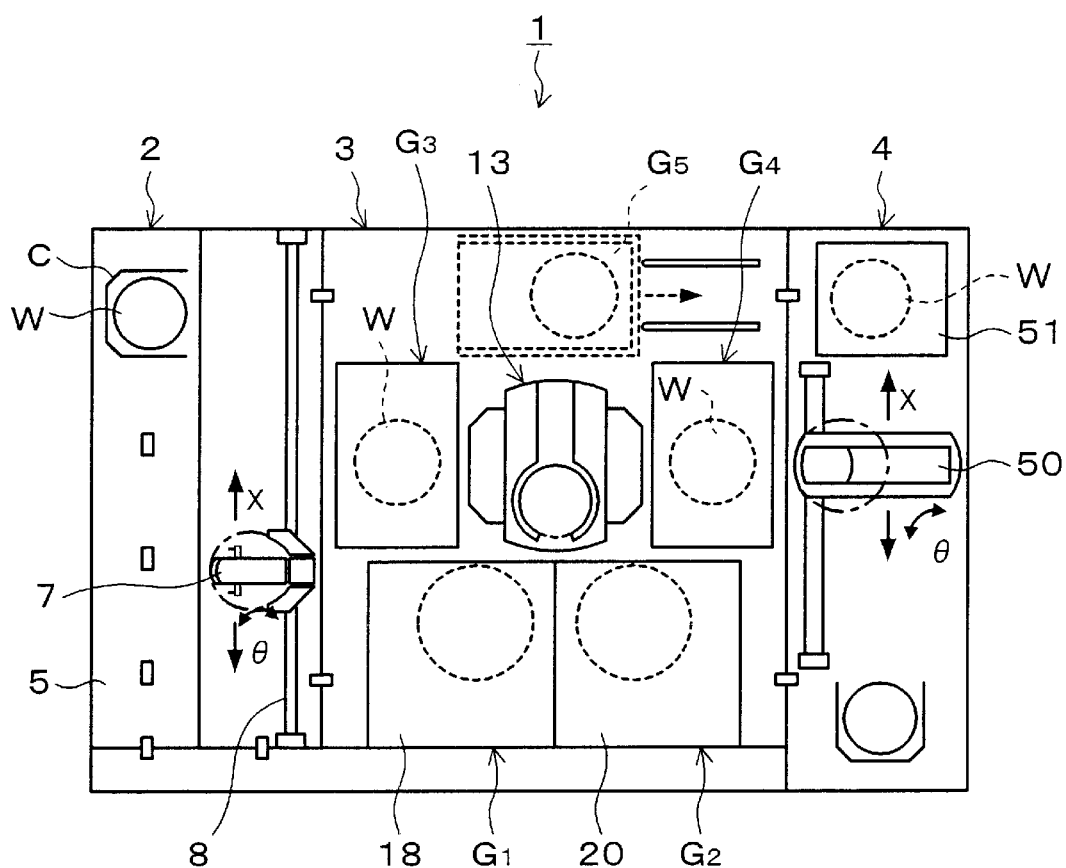
FIG. 1 is a plan view showing a schematic structure of a coating and developing system, having a coating solution supply unit according to a first embodiment of the present invention.
Figure 2:
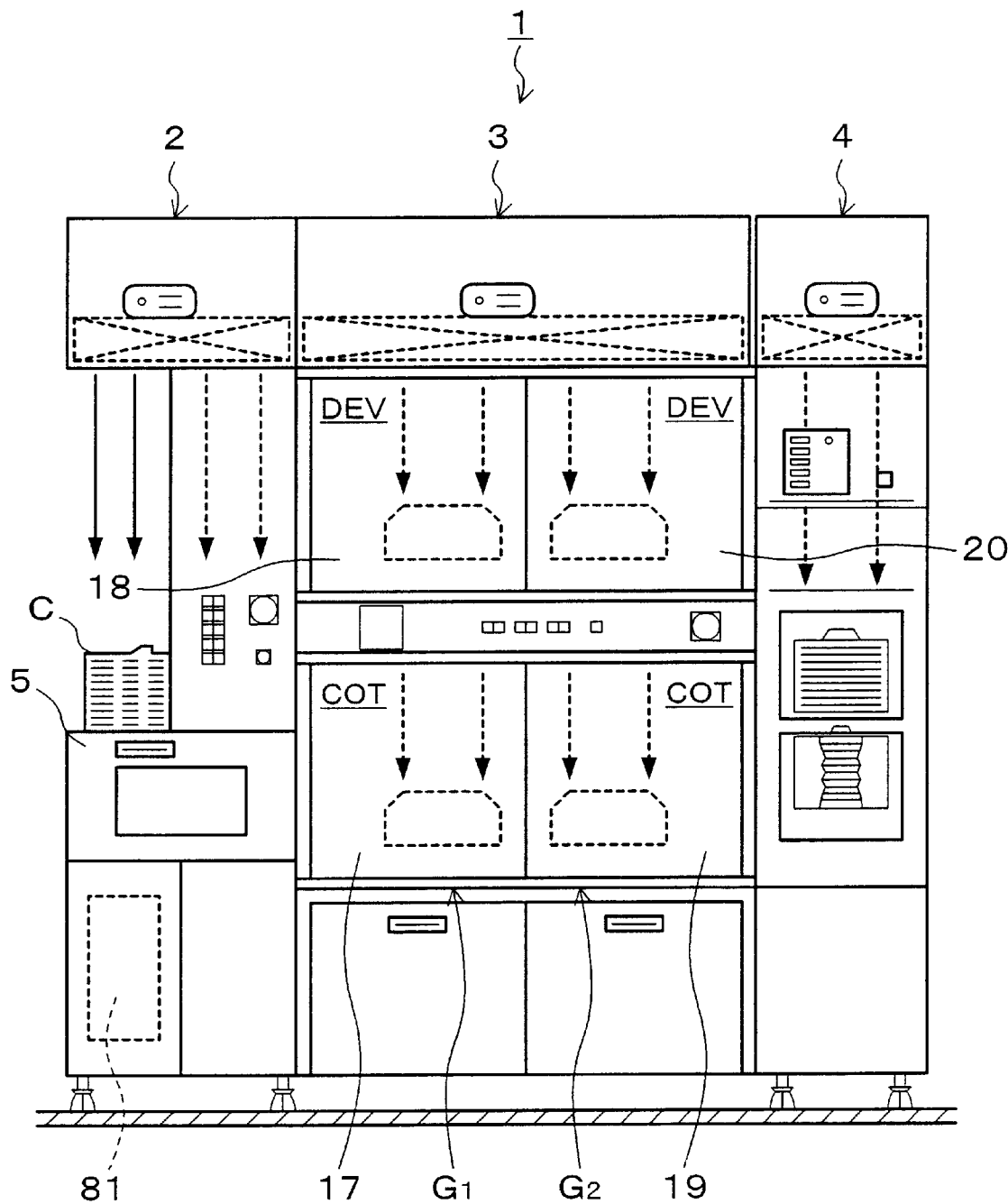
FIG. 2 is a front view of the coating and developing system in FIG. 1.
Figure 3:
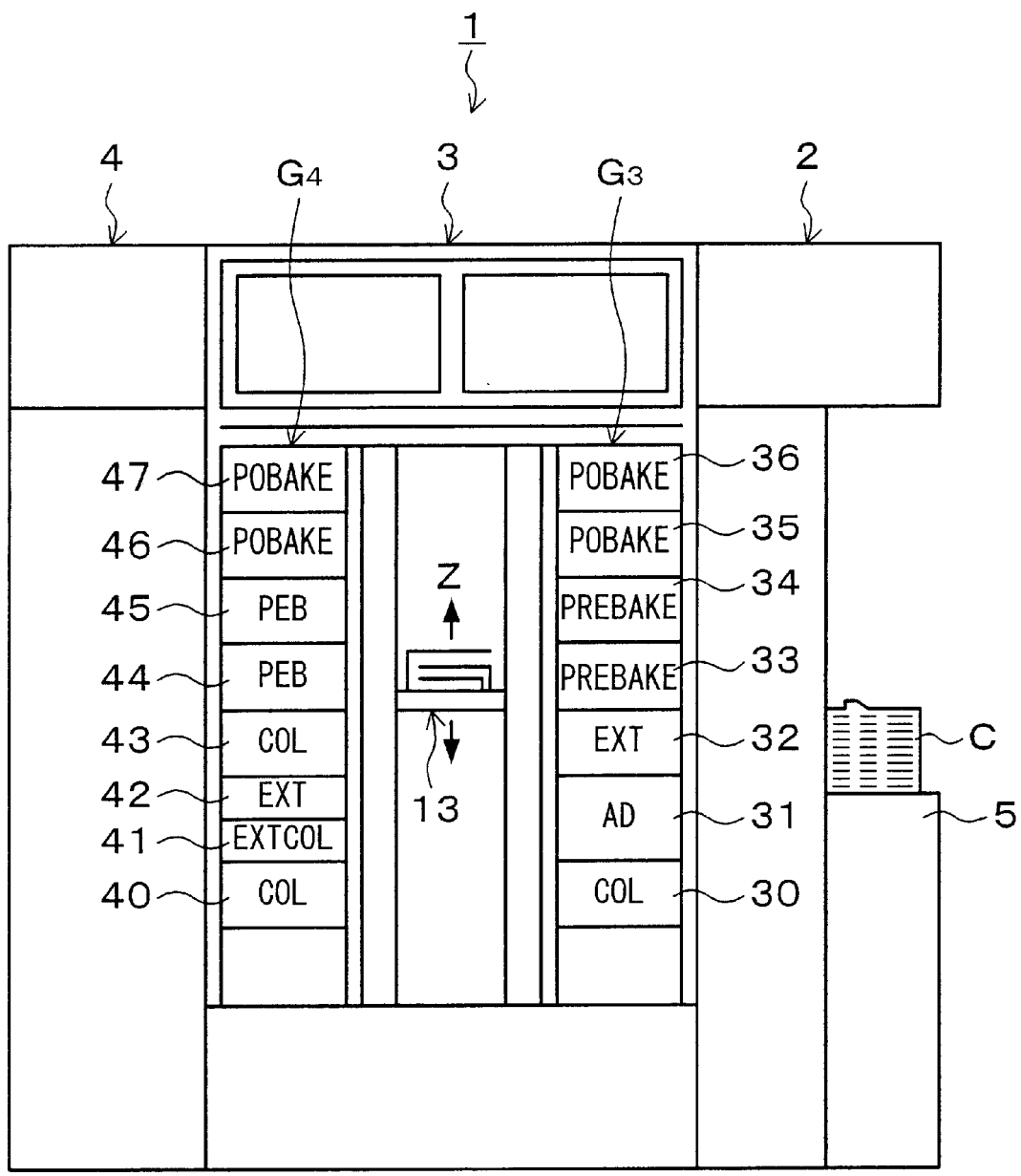
FIG. 3 is a rear view of the coating and developing system in FIG. 1.

Preferred embodiments of the present invention will be described below. FIG. 1 is a plan view of a coating and developing system 1 having a coating solution supply unit according to the present embodiment, FIG. 2 is a front view of the coating and developing system 1, and FIG. 3 is a rear view of the coating and developing system 1.

As shown in FIG. 1, the coating and developing system 1 has a structure in which a cassette station 2 for carrying, for example, 25 wafers W from/to the outside to/from the coating and developing system 1 in the unit of cassette and for carrying the wafers W into/from a cassette C, a processing station 3 with various kinds of processing units disposed in multi-tiers for performing predetermined processing one by one in the coating and developing process, and an interface section 4 provided adjacent to the processing station 3, for receiving and delivering the wafer W from/to an aligner which is not shown, are integrally connected.

In the cassette station 2, a plurality of the cassettes C are mountable at predetermined positions on a cassette mounting table 5 serving as a mounting section in a line in an X-direction (a perpendicular direction in FIG. 1). Further, a wafer carrier 7, which is transferable in the direction of the alignment of the cassettes (an X-direction) and in the direction of the alignment of the wafers W housed in the cassette C (a Z-direction; a perpendicular direction), is provided to be movable along a carrier guide 8 and is selectively accessible to the respective cassettes C. Below the cassette station 2, a gallon bottle 81, for example, is disposed serving as a treatment solution supply source.

The wafer carrier 7 has an alignment function for aligning the wafer W. The wafer carrier 7 is structured so as to be also accessible to an extension unit 32 included in a third processing unit group G3 on the side of the processing station 3 as will be described later.

In the processing station 3, a main carrier unit 13 is provided in a center part thereof, and various kinds of processing units are multi-tiered on the periphery of the main carrier unit 13 to compose processing unit groups. In the coating and developing system 1, there are four processing unit groups G1, G2, G3 and G4, and a first and a second processing unit groups G1 and G2 are disposed on the front side of the coating and developing system 1, the third processing unit group G3 is disposed adjacent to the cassette station 2, and a fourth processing unit group G4 is disposed adjacent to the interface section 4. Further, as an option, a fifth processing unit group G5 depicted by broken lines can be additionally arranged on the rear side of the coating and developing system 1. The main carrier unit 13 can carry the wafer W into/from various kinds of processing units described later disposed in these processing unit groups G1 to G5.

In the first processing unit group G1, for example, as shown in FIG. 2, a resist coating unit 17, to which a resist solution is supplied from the coating solution supply unit according to the present embodiment, and a developing unit 18 for performing treatment on the wafer W with a developing solution supplied are two-tiered in the order from the bottom. As for the second processing unit group G2, a resist coating unit 19 and a developing unit 20 are similarly two-tiered in the order from the bottom.

In the third processing unit group G3, for example, as shown in FIG. 3, a cooling unit 30 for cooling the wafer W, an adhesion unit 31 for increasing the fixability between the resist solution and the wafer W, the extension unit 32 for keeping the wafer W waiting, pre-baking units 33 and 34 for drying a solvent in the resist solution, and post-baking units 35 and 36 for performing heating processing after developing treatment, and so on are, for example, seven-tiered in the order from the bottom.

In the fourth processing unit group G4, for example, a cooling unit 40, an extension and cooling unit 41 for spontaneously cooling the placed wafer W, an extension unit 42, a cooling unit 43, post-exposure baking units 44 and 45 for performing heat treatment after exposure processing, post-baking units 46 and 47 and so on are, for example, eight-tiered in the order from the bottom.

In the center part of the interface section 4, a wafer carrier 50 is provided. The wafer carrier 50 is structured so as to be movable in the direction X (the up-and-down direction in FIG. 1) and the direction Z (the perpendicular direction), and to be rotatable in a direction θ (a rotational direction about an axis Z), so that it can access the extension and cooling unit 41, the extension unit 42 which are included in the fourth processing unit group G4, a peripheral aligner 51, and an aligner which is not shown.

As described above, the embodiment of the present invention is materialized as the coating solution supply unit for supplying the resist solution to the resist coating unit 17.

Figure 4:
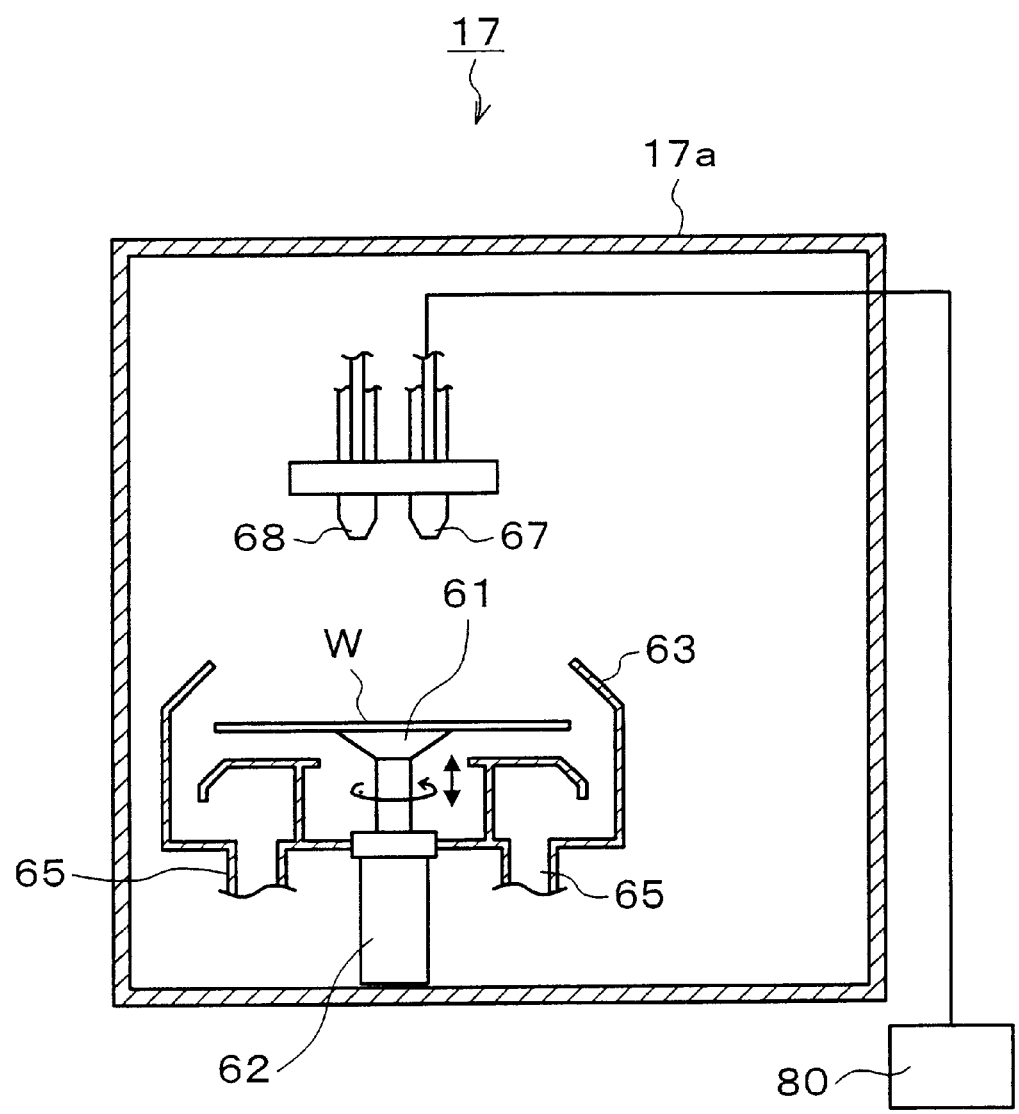
FIG. 4 is an explanatory view of a vertical cross section of a resist coating unit to which a resist solution is supplied by the coating solution supply unit according to the first embodiment.

First, the structure of the resist coating unit 17 will be described. As shown in FIG. 4, in a casing 17a of the resist coating unit 17, a spin chuck 61 is disposed for holding the wafer W horizontally by suction. On a bottom side of the spin chuck 61 a drive mechanism 62 having, for example, a motor and so on, for rotating the spin chuck 61 is attached. Therefore, when resist solution coating on the wafer W is performed, the wafer W is held on the spin chuck 61 by suction, and undergoes resist solution coating while the wafer W is rotated. Furthermore, the drive mechanism, having a function for moving the spin chuck 61 freely up and down, moves the spin chuck 61 up and down when the wafer W is carried in/out so that the wafer W is delivered to/from a main carrier unit 13.

In an outer periphery of the spin chuck 61, a cup 63 with its upper face open is provided to surround the spin chuck 61. The cup 63 surrounds a side part and a lower part of the spin chuck to be formed to house the wafer W undergoing the treatment. Therefore, it can collect the resist solution scattering around from the wafer W due to the rotation of the wafer W during coating treatment and prevent peripheral units to be contaminated by the scattering resist solution. In addition, in a bottom portion of the cup 63, a drainpipe 65 communicated with it for discharging the solution is provided, and the resist solution collected as described above is discharged from the drainpipe 65.

A discharge nozzle 67 for discharging the resist solution on, for example, the wafer W and a solvent discharge nozzle 68 for discharging a solvent of the resist solution on the wafer W move above a center of the spin chuck 61. Therefore, the discharge nozzle 67 is movable above the center of the wafer W. When the resist solution is discharged from the discharge nozzle 67 on the center of the wafer W rotated by the drive mechanism 62, a predetermined resist film is formed on the wafer by a so-called spin coating method.

Figure 5:
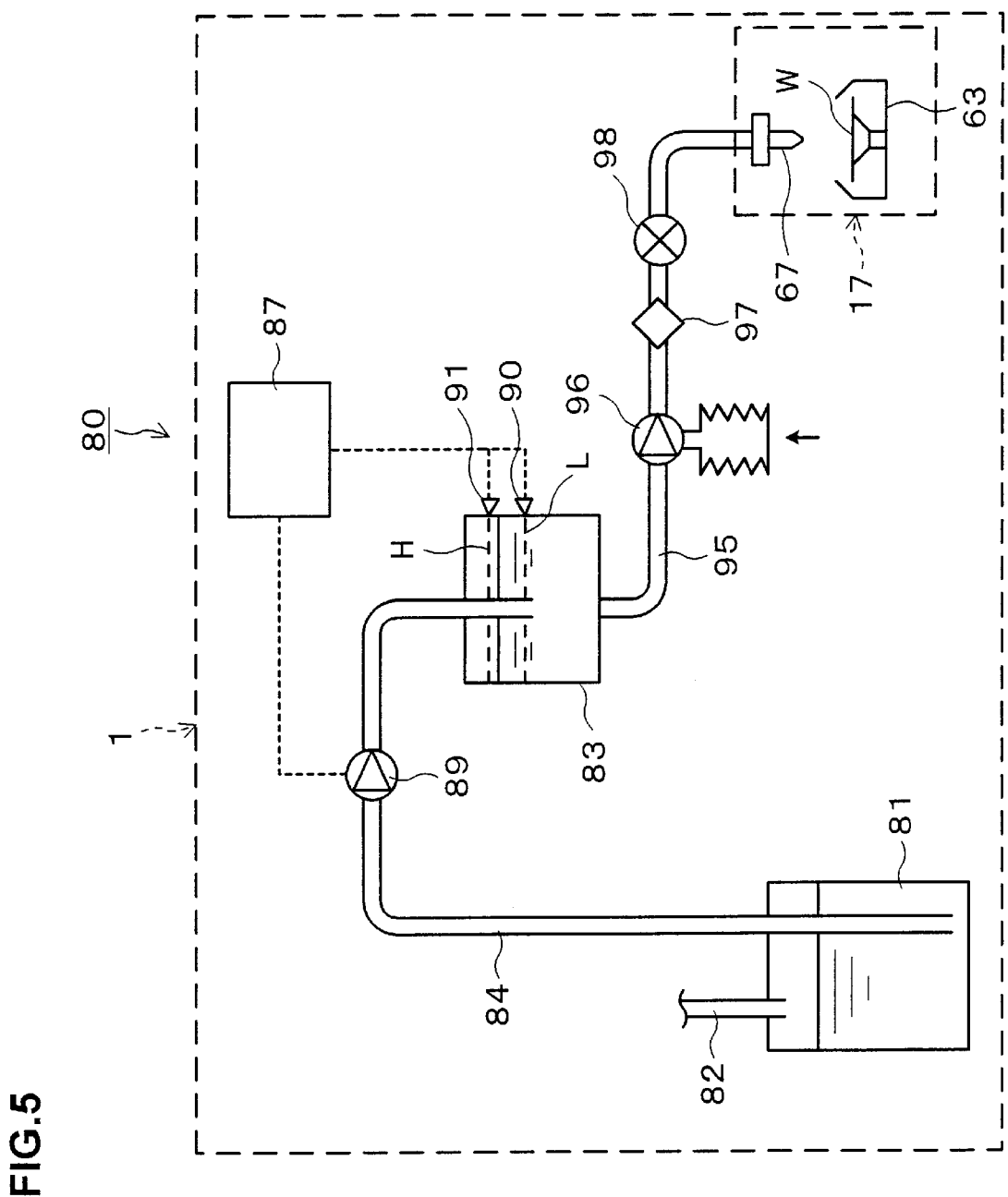
FIG. 5 is an explanatory view of the coating solution supply unit according to the first embodiment.

Next, the coating solution supply unit 80 for supplying the resist solution to the resist coating unit 17 will be described. As shown in FIG. 5, the resist solution is usually stored in the gallon bottle 81 disposed below the cassette station 2, which serves as the treatment solution supply source. To the gallon bottle 81 an auxiliary pipeline 82 for supplying the resist solution to the gallon bottle 81 is provided, through which the resist solution is forcibly fed by nitrogen gas, which is inactive gas, at the time of supplying.

The gallon bottle 81 is communicated with an intermediate buffer tank 83, which serves as a storage portion, by a first pipeline 84. To the first pipeline 84 a first pump 89 serving as another pump is attached, and it is so structured to supply the resist solution in the gallon bottle 81 to the intermediate buffer tank 83. The first pump 89 is controlled by a pump controller 87, and by the order from the pump controller 87 the first pump 89 is put into operation so that the resist solution in the gallon bottle 81 is supplied in the intermediate buffer tank 83. There is a case where a plurality of the gallon bottles 81 are disposed, and in this case the first pipeline 84 with the first pump 89 attached thereto as described above is disposed to each of the respective gallon bottles 81, and is communicated with the single intermediate buffer tank 83.

To the intermediate buffer tank 83 a low-level level sensor 90, which serves as a sensor, for detecting that the level height of the resist solution in the intermediate buffer tank 83 lowers to the minimum allowable height L, and a high-level level sensor 91 for detecting that the said level rises to the maximum allowable height H are attached.

Signals from the low-level level sensor 90 and the high-level level sensor 91 are inputted to the pump controller 87. Therefore, when the level height in the intermediate buffer tank 83 lowers to reach the minimum allowable height L after the resist solution is discharged on the wafer W from the discharge nozzle 67, the low-level level sensor 90 detects it and the signal is sent to the pump controller 87. Then, from the pump controller 87 an operation order is given to the first pump 89, so that the resist solution in the gallon bottle 81 is supplied to the intermediate buffer 83.

When the level rises to the maximum allowable height H after the resist solution is supplied in the intermediate buffer tank 83 in this way, the high-level level sensor 91 detects it, and according to the signal from the high-level level sensor 91 the pump controller 87 stops the operation of the first pump 89.

The intermediate buffer tank 83 is communicated with the discharge nozzle 67 in the resist coating unit 17 by a second pipeline 95. To the second pipeline 95, a second pump 96 in a bellows type for forcibly feeding the resist solution in the intermediate buffer tank 83 to the discharge nozzle 67 is provided. At a discharge nozzle 67 side of the second pump 96 in the second pipeline 95, that is a downstream side, the filter 97 is attached for removing impurities and air bubbles in the resist solution, and further downstream a valve 98 for finally controlling a discharge timing to the wafer W in accordance with an operation signal of the second pump is disposed. The second pump 96 and the valve 98 are controlled by a controller which is not shown.

The operations of the resist coating unit 17 and the coating solution supply unit 80 as structured above will be described together with a photolithography process performed in the coating and developing system 1.

First, an unprocessed wafer W is taken out of the cassette C by the wafer carrier 7, and then carried into the adhesion unit 31 included in the third processing unit group G3, and is coated with, for example, HMDS for improving the adhesion of the resist solution on its surface. Next, the wafer W is carried to the cooling unit 30 by the main carrier unit 13 and cooled to a predetermined temperature. Thereafter, the wafer W is carried to the resist coating unit 17 or 19.

In the resist coating unit 17 or 19, the wafer W coated with the resist solution is then carried to the pre-baking unit 33 or 34 and to the cooling unit 40 in sequence by the main carrier unit 13. After that, the wafer W undergoes predetermined treatment such as exposure treatment, developing treatment and so on in the respective processing units, and a series of the coating and developing treatment is finished.

Detailing the operation in the above resist coating unit 17, the wafer W after undergoing the above-described treatment is first carried into the resist coating unit 17 by the main carrier unit 13. Then, the wafer W is held by suction by the spin chuck 61, which has been raised by the drive mechanism 62 and has been waiting in advance, and after that, the spin chuck 61 is lowered by the drive mechanism 62 to stop in a predetermined position in the cup 63. Next, the wafer W on the spin chuck 61 is rotated at a predetermined rotation speed by a rotation mechanism of the drive mechanism 62. Then, a predetermined solvent is supplied on the wafer W from the solvent supply nozzle 68 first. After that, the resist solution supplied by the coating solution supply unit 80 is discharged on the rotating wafer W from the discharge nozzle 67 to perform resist coating treatment. Then, the wafer W, on which a predetermined resist film has been formed after undergoing the coating treatment, is raised again by the drive mechanism 62, and transferred to the main carrier unit to be carried out from the resist coating unit 17.

Next, the process of the coating solution supply unit 80 for supplying the resist solution to the resist coating unit 17 will be described.

First, when the wafer W is mounted on the spin chuck 61 and rotated in the resist coating unit 17 as described above, the second pump 96 is put into operation, and the resist solution in the intermediate buffer tank 83 is discharged from the discharge nozzle 67 through the second pipeline 95. Incidentally, since the discharge pressure of the resist solution at this time is dependent on the pressure given to an admission port of the second pump 96, if the level height of the resist solution in the intermediate buffer tank 83 fluctuates to change its potential energy, the pressure given to the admission port of the second pump 96 also changes and as a result, the discharge pressure fluctuates. Therefore, in order to keep the discharge pressure steady, it is necessary to store the resist solution in the intermediate buffer tank 83 temporarily and control the fluctuation of the level in the intermediate buffer tank 83 to the minimum so that the installation condition of the gallon bottle 81 can be neglected.

When the resist solution is discharged from the discharge nozzle 67, the level height in the intermediate buffer tank 83 lowers, and when it reaches the minimum allowable height L, the low-level level sensor 90 detects it and transmits a predetermined signal to the pump controller 87. The pump controller 87 which receives this signal orders the first pump 89 to operate, and the resist solution in the gallon bottle 81 is supplied in the intermediate buffer tank 83.

This supply raises the level in the intermediate buffer tank 83, and when it reaches the maximum allowable height H, the high-level level sensor 91 detects it and stops the operation of the first pump 89 via the pump controller 87. In this way, the resist solution is supplied from the gallon bottle 81 each time the level of the resist solution in the intermediate buffer tank 83 reaches the minimum allowable height L after the resist solution is discharged on the wafer W, so that the level height in the intermediate buffer tank 83 is constantly maintained at the height between the maximum allowable height H and the minimum allowable height L.

Therefore, since the level height in the intermediate buffer tank 83 is maintained within a predetermined range, the pressure given to a primary side of the second pump 96, that is, an upstream side, is maintained at a predetermined value, to maintain the discharge pressure at a predetermined pressure, so that a predetermined amount of the resist film is formed on the wafer W. Incidentally, though the low-level level sensor 90 and the high-level level sensor 91 are used as sensors to detect the level height in the intermediate buffer tank 83 in this embodiment, other means for detecting the level height, such as a float level gauge, may be used.

Though in the above embodiment, the level height of the resist solution in the intermediate buffer tank 83 is maintained by using the level sensors 90 and 91, the level height may be maintained by associating the operations of the first pump 89 and the second pump 96 with each other. This will be detailed below as a second embodiment.

Figure 6:
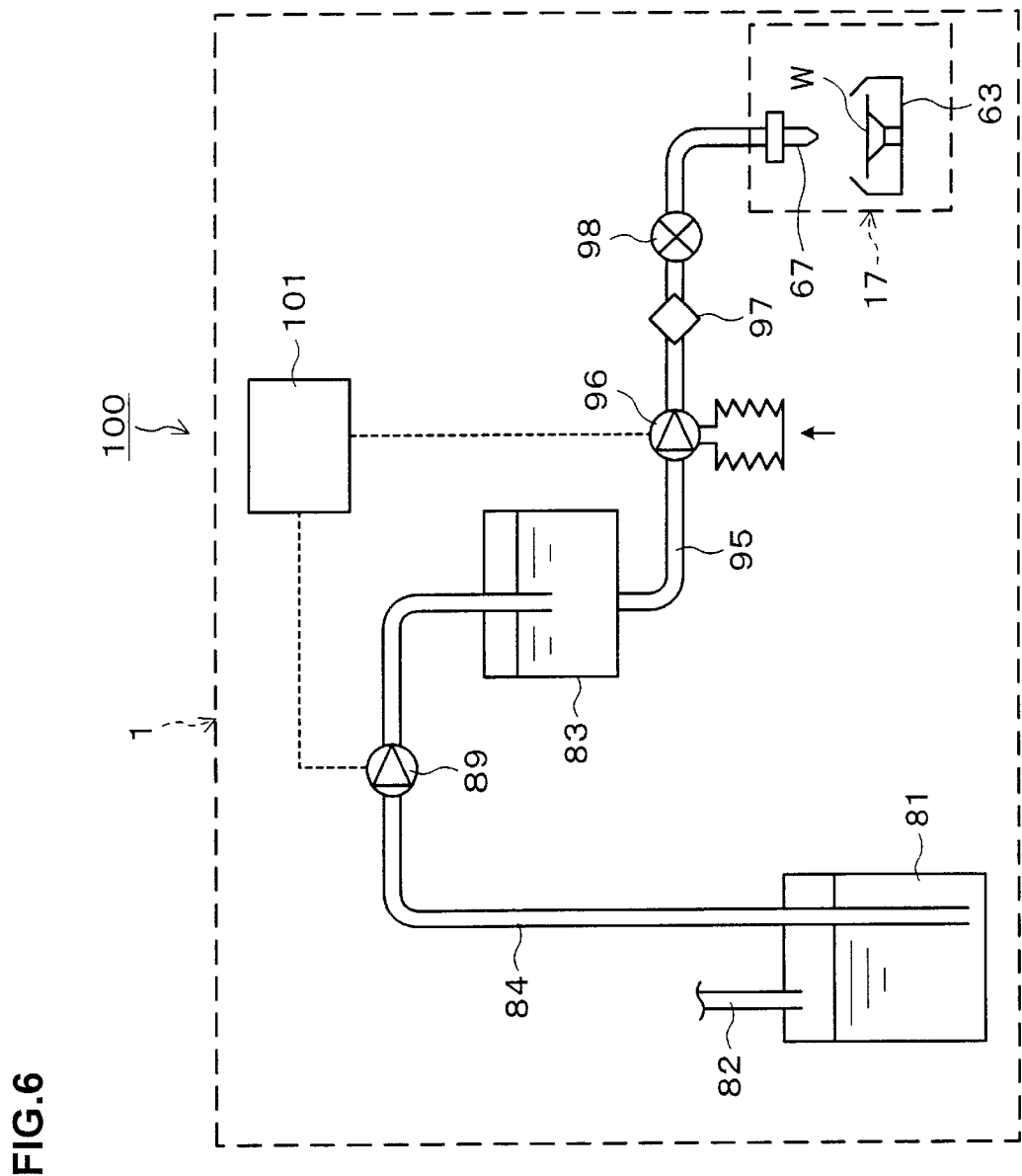
FIG. 6 is an explanatory view of a coating solution supply unit according to a second embodiment.

First, though the structure of a coating solution supply unit 100 according to the second embodiment is substantially the same as that of the coating solution supply unit 80 in the first embodiment, the second pump 96 is controlled by a pump controller 101 which also controls the first pump 89 as shown in FIG. 6. The pump controller 101 controls the first pump 89 and the second pump 96 associating the operations of them with each other. To be more concrete, the first pump 89 is put into operation in accordance with the operation timing of the second pump 96.

Next, to describe the process of the coating solution supply unit 100 as structured above, first, when the wafer W is held by the spin chuck 61 in the resist coating unit 17 and rotated by the drive mechanism 62 in the same way as in the above-described first embodiment, the second pump 96 is put into operation, so that the resist solution is discharged on the wafer W. Then, the first pump 89 is put into operation by the pump controller 101 with the operation of the second pump 96 working as a trigger, so that the resist solution is supplied in the intermediate buffer tank 83 from the gallon bottle 81. The amount of the resist solution supplied at this time is made to match the amount discharged on the wafer W by the second pump 96 as described above.

By controlling the second pump 96 in this way, the level height of the resist solution in the intermediate buffer tank 83 is maintained at a predetermined height. Accordingly, the discharge pressure of the resist solution discharged from the discharge nozzle 67 is maintained within a predetermined range, and as a result, the discharge pressure from the discharge nozzle 67 is maintained steady, so that the resist film of a predetermined thickness is formed on the wafer W. Incidentally, the operation timings of the second pump 96 and the first pump 89 may be the same, or the first pump 89 may be put into operation after some time lag, for example, after a predetermined time passes from the operation of the second pump 96 on the condition that the level of the resist solution in the intermediate buffer tank 83 is maintained at a predetermined height.

Next, a third embodiment will be described. A coating solution supply unit 105 in the third embodiment is so structured that the number of times the second pump 96 in a so-called bellows type is pushed in is measured, and when the number of measured push-in times reaches a predetermined number, the first pump 89 is put into operation to maintain the level height in the intermediate buffer tank 83.

Figure 7:
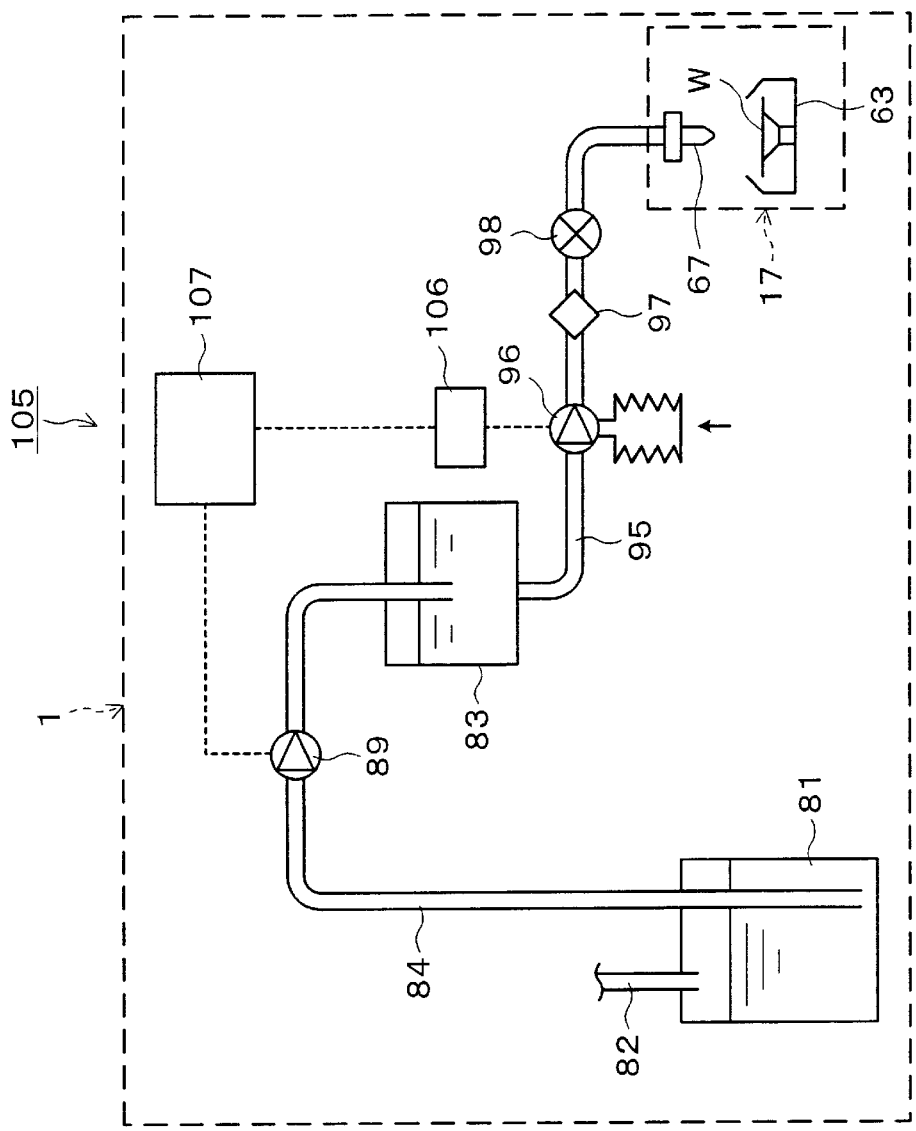
FIG. 7 is an explanatory view of a coating solution supply unit according to a third embodiment.

In the third embodiment, a counter 106 for measuring the number of times the second pump 96 is pushed in is provided as shown in FIG. 7. The counter 106 is structured to be able to set a predetermined number of the push-in times. In addition, the counter 106 is so structured to send the signal to the pump controller 107 when a measured value for the number of the push-in times reaches a predetermined number of times. The pump controller 107 also has a function for controlling the operation of the first pump 89 based on this signal.

Incidentally, a predetermined number of times for the number of times the second pump 96 is pushed in means the number of times within a range where the accumulated amount of a discharge amount discharged by pushing in a bellows portion can maintain the level height in the intermediate buffer tank 83 at a predetermined height, so it may be once or a plurality of times, and this predetermined number of times is set in advance to, for example, the counter 106.

Therefore, in the process by the coating solution supply unit 105, the second pump 96 in a push-in type, for example, in a bellows type, operates first, and then the resist solution is supplied on the wafer W from the discharge nozzle 67. At this time, the counter 106 measures the number of times the second pump 96 is pushed in. Then, when the number of the push-in times reaches a predetermined number of times, the counter 106 sends the signal to the pump controller 107.

The pump controller 107 puts the first pump 89 into operation with this signal working as a trigger. Then, the same amount of the resist solution as that of the resist solution forcibly fed by the second pump 96 to the discharge nozzle 67, for example, the amount of the resist solution forcibly fed by one push-in operation multiplied by a predetermined number of times, is supplied from the gallon bottle 81 to the intermediate buffer tank 83.

As a result, the level height of the resist solution in the intermediate buffer tank 83 is maintained at a predetermined height. Thus, the discharge pressure of the resist solution discharged from the discharge nozzle 67 at the time of coating treatment is maintained within a predetermined range to form a predetermined amount of the resist film on the wafer W.

Figure 8:
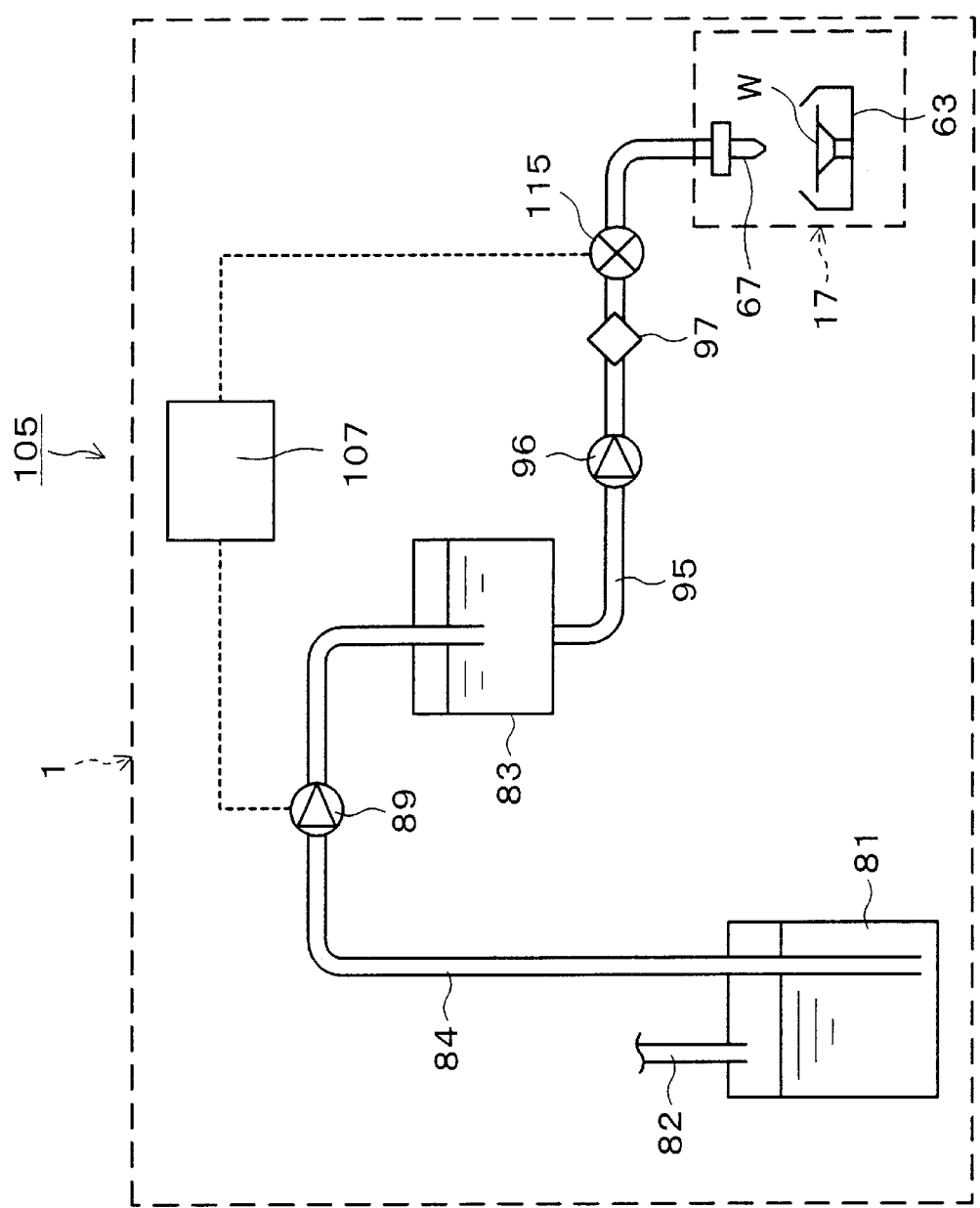
FIG. 8 is an explanatory view of the coating solution supply unit in another embodiment according to the third embodiment.

Though the second pump 96 as described above is a bellows type pump, other types, for example, a diaphragm type pump, may be used as long as it is a push-in type pump. Even if such a pump is not used, it is possible in a coating solution supply unit that a predetermined amount of the resist solution could be supplied on the wafer W each time by using a valve. For example, as shown in FIG. 8, when a valve 115 is provided in the second pipeline 95, and the supply and the supply stop of the resist solution is controlled by the opening and closing of the valve 115, the first pump 89 may be put into operation in the same way as in the third embodiment by counting the number of opening and closing times of the valve 115.

Furthermore, as in the third embodiment, the second pump 96 in another embodiment may be a pump in types other than a push-in type, for example, a rotation type.

The above-described embodiments, where a single gallon bottle 81 is provided, may be applicable when a plurality of gallon bottles 81 are provided if necessary. In this case, since supply sources of a coating solution are different from each other, level heights may sometimes differ greatly from each other due to the difference of the positions where the gallon bottles are placed and their remaining amount.

In this case, too, the resist solution is stored in the intermediate buffer tank 83 for common use temporarily, and its level is maintained within a predetermined range as described above, so that the resist solution can be discharged on the wafer W with the same discharge pressure no matter which of the gallon bottles the resist solution is supplied from. Particularly, since level heights in the respective gallon bottles are greatly different from each other when two or more gallon bottles are disposed in a vertical tier, the intermediate buffer tank is provided as described above to improve the uniformity of the discharge pressures to a great extent by maintaining its level height.

The above-described embodiments, where the resist solution is supplied to the single discharge nozzle 67 from the intermediate buffer tank 83, are also applicable when the resist solution is supplied to a plurality of discharge nozzles.

Figure 9:
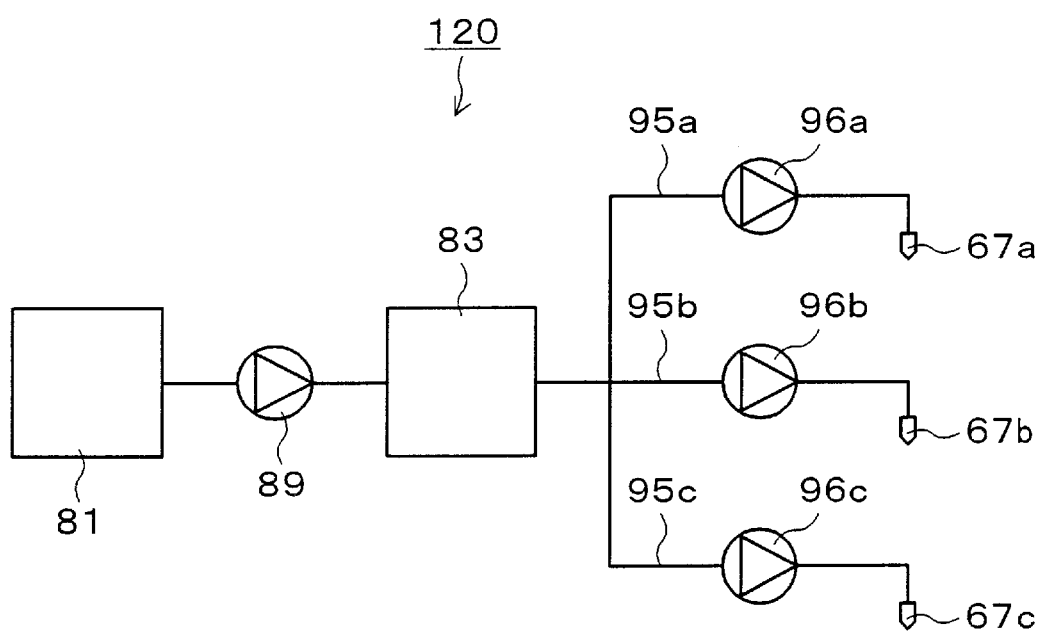
FIG. 9 is an explanatory view showing a rough view of a coating solution supply unit schematically when the resist coating unit has plural discharge nozzles.

In a coating solution supply unit 120 having discharge nozzles 67a, 67b, and 67c, for example as shown in FIG. 9, respective second pipelines 95a, 95b and 95c, which communicate the intermediate buffer tank 83 with respective discharge nozzles 67a, 67b, and 67c, are disposed. To the second pipelines 95a, 95b, and 95c respective second pumps 96a, 96b, and 96c are attached. Then, for the respective supply paths, the mechanisms described in the first, second, or third embodiments, for maintaining the level height in the buffer tank 83 at a predetermined height are provided to maintain the discharge pressures of the resist solutions discharged from all of the discharge nozzles 67a, 67b, and 67c within a predetermined range. Therefore, when a plurality of discharge nozzles 67 are provided, a predetermined discharge pressure is also maintained for all of the discharge nozzles 67a, 67b, and 67c, so that a predetermined resist film is formed on the wafer W in all of the resist coating units.

Figure 10:
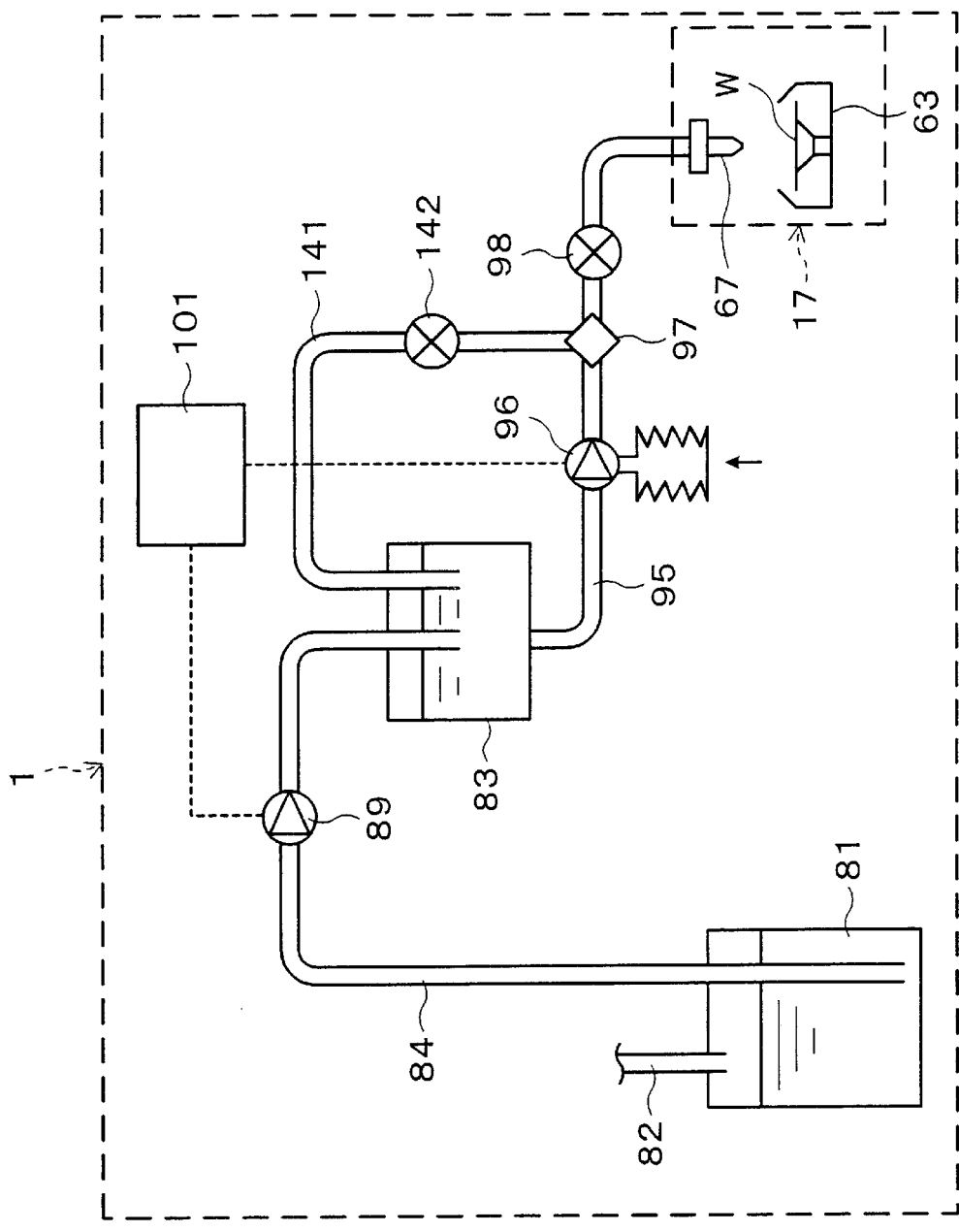
FIG. 10 is an explanatory view of a treatment solution supply unit having a pipeline for air bubble venting.

Still another embodiment will be described. In an example as shown in FIG. 10, a pipeline for air bubble venting 141 is laid between the filter 97 and the intermediate buffer tank 83, and to this pipeline 141 a valve 142 for air bubble venting is provided. Therefore, air bubbles collected in the filter 97 are returned to the intermediate buffer tank 83 through the pipeline 141 by opening the valve 142.

Usually, air bubbles collected by the filter 97 of this kind are disposed as drains, but according to the example in FIG. 10, they are returned to the intermediate buffer tank 83 to be usable again, so that an effective use of the resist solution can be realized.

Yet another embodiment is described. In an example shown in FIG. 11, the second pump 96 is omitted when an intake port 95a of the second pipeline 95 in the intermediate buffer tank 83, that is, an intake port 95a for taking in the resist solution in the intermediate buffer tank 83 into the second pipeline 95, is positioned higher than the discharge nozzle 67. In other words, the resist solution in the intermediate buffer tank 83 is discharged from the discharge nozzle 67 by a pressure difference caused by a height difference. A discharge amount is controlled by the opening and closing operation of the valve 98. Thus the whole unit is simplified.

Figure 11:
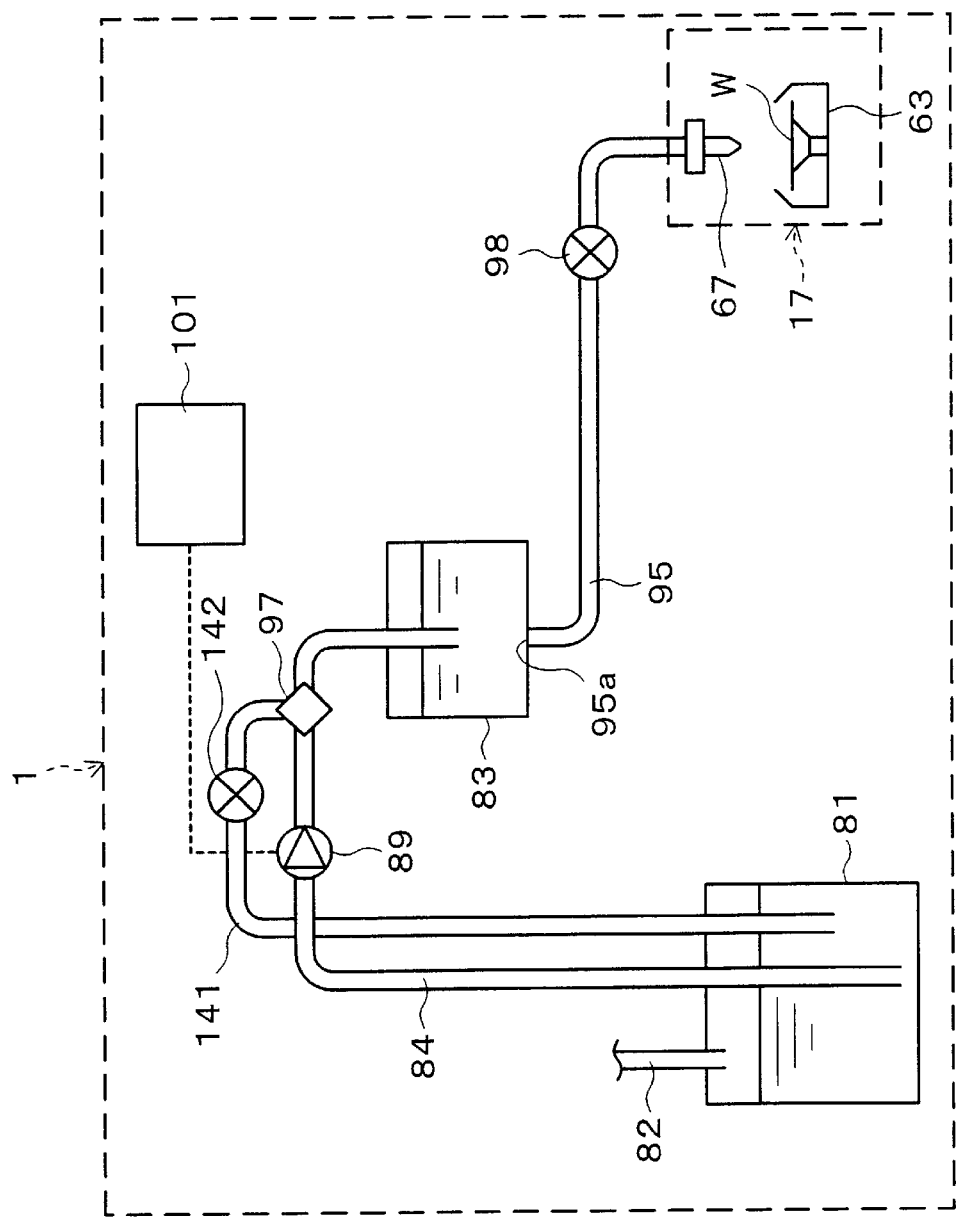
FIG. 11 is an explanatory view of another treatment solution supply unit omitting a second pump.
Figure 12:
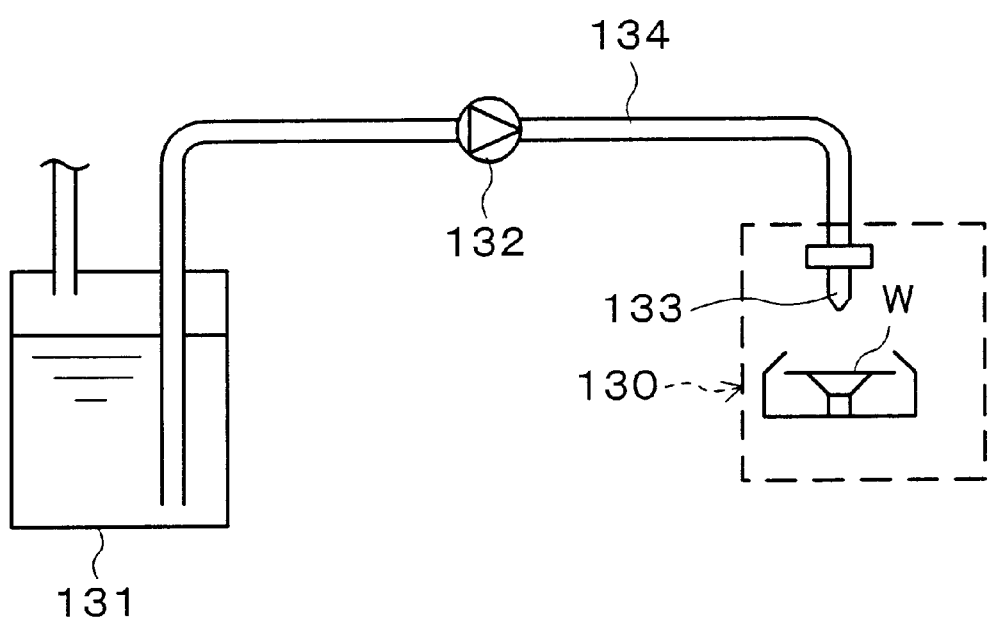
FIG. 12 is an explanatory view showing a rough view of a conventional treatment solution supply unit.

In an example shown in FIG. 11, the filter 97 is provided at a downstream side of the first pump 89 in the first pipeline 84. The pipeline for air bubble venting 141 is laid between the filter 97 and the gallon bottle 81. Therefore, in an example shown in FIG. 11, the air bubbles of the resist solution collected by the filter are returned to the gallon bottle 81 by the opening of the valve 142. Thus, in an example in FIG. 11 an effective use of the resist solution can also be realized.

The above described embodiments are materialized as a coating solution supply unit for supplying the resist solution to the resist coating unit, but may, of course, be materialized as other treatment solution supply units such as a development solution supply unit and so on. Furthermore, though a substrate is a wafer, they are applicable to a coating unit for other substrates, for example, an LCD substrate.

As described above, according to the present invention, since the level height of the treatment solution in the storage portion is maintained at a predetermined height, the fluctuation of the discharge pressure to the substrate caused by the fluctuation of the level height of the treatment solution as in a conventional treatment solution supply source is reduced, this discharge pressure is maintained within a predetermined range. Consequently, owing to the stable discharge of the treatment solution a substrate processing is performed in a preferable way to improve a yield.

Operating the pump for supplying the treatment solution from the storage portion to the discharge nozzle in association with the said another pump for supplying the treatment solution to the storage portion from the treatment solution supply source can reduce the fluctuation of the level height in the storage portion to a smaller level, and maintain the discharge pressure of the treatment solution within a narrower predetermined range.

When a plurality of the nozzles are provided, the discharge pressure is also maintained within a predetermined range, and the same discharge pressure of the treatment solution, in addition, is also maintained for these discharge nozzles, so that the same treatments are performed simultaneously, which improves a throughput.

Furthermore, as the air bubbles of the treatment solution, which are conventionally disposed as drains, can be utilized again, an effective use of the treatment solution can be realized.

What is claimed is:
1. A treatment solution supply method for supplying, with a treatment solution in a treatment solution supply source forcibly fed by a pump, said treatment solution on a substrate through a supply path connecting said treatment solution supply source and a discharge nozzle, wherein a storage portion for storing said treatment solution temporarily is disposed in said supply path between said treatment solution supply source and said pump, and another pump for supplying said treatment solution to said storage portion is disposed in said supply path between said storage portion and said treatment solution supply source, and comprising:

the step of maintaining the level height of said treatment solution in said storage portion at a predetermined height by supplying said treatment solution to said storage portion by said another pump, wherein said treatment solution is a resist solution.

2. A treatment solution supply method for supplying, with a treatment solution in a treatment solution supply source forcibly fed by a pump, said treatment solution on a substrate through a supply path connecting said treatment solution supply source and a discharge nozzle, wherein a storage portion for storing said treatment solution temporarily is disposed in said supply path between said treatment solution supply source and said pump, and another pump for supplying said treatment solution to said storage portion is disposed in said supply path between said storage portion and said treatment solution supply source, and comprising:

the step of maintaining the level height of said treatment solution in said storage portion at a predetermined height by operating said pump in association with said another pump, wherein said treatment solution is a resist solution.

3. A treatment solution supply method for supplying, with a treatment solution in a treatment solution supply source forcibly fed by a pump, said treatment solution on a substrate through a supply path connecting said treatment solution supply source and a discharge nozzle, wherein a storage portion for storing said treatment solution temporarily is disposed in said supply path between said treatment solution supply source and said pump, and another pump for supplying said treatment solution to said storage portion is disposed in said supply path between said storage portion and said treatment solution supply source, and comprising:

the step of detecting the level height in said storage portion; and the step of maintaining the level height of said treatment solution in said storage portion at a predetermined height by supplying said treatment solution to said storage portion from said another pump only when said level height becomes lower than a predetermined value, wherein said treatment solution is a resist solution.

4. A treatment solution supply method for supplying, with a treatment solution in a treatment solution supply source forcibly fed by a pump, a predetermined amount of said treatment solution each time on a substrate through a supply path connecting said treatment solution supply source and a discharge nozzle, wherein a storage portion for storing said treatment solution temporarily is disposed in said supply path between said treatment solution supply source and said pump, and another pump for supplying said treatment solution to said storage portion is disposed in said supply path between said storage portion and said treatment solution supply source, and comprising:

the step of measuring the number of times said predetermined amount is supplied; and the step of maintaining the level height of said treatment solution in said storage portion at a predetermined height by supplying said treatment solution to said storage portion by said another pump only when said number of supply times exceeds a predetermined number of times, wherein said treatment solution is a resist solution.

* * * * *